US009590044B2

(12) United States Patent
Ruhl et al.

(10) Patent No.: US 9,590,044 B2
(45) Date of Patent: Mar. 7, 2017

(54) TWO-DIMENSIONAL MATERIAL CONTAINING ELECTRONIC COMPONENTS

(71) Applicant: Infineon Technologies AG, Neubiberg (DE)

(72) Inventors: Guenther Ruhl, Regensburg (DE); Wolfgang Lehnert, Lintach (DE); Rudolf Berger, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/860,612

(22) Filed: Apr. 11, 2013

(65) Prior Publication Data

US 2014/0306184 A1    Oct. 16, 2014

(51) Int. Cl.

| | |
|---|---|
| *H01L 29/76* | (2006.01) |
| *B82Y 10/00* | (2011.01) |
| *H01L 27/00* | (2006.01) |
| *H01L 31/10* | (2006.01) |
| *B82Y 20/00* | (2011.01) |
| *H01L 29/16* | (2006.01) |
| *H01L 29/40* | (2006.01) |
| *H01L 29/778* | (2006.01) |
| *H01L 29/861* | (2006.01) |

(52) U.S. Cl.
CPC ........ *H01L 29/1606* (2013.01); *H01L 29/408* (2013.01); *H01L 29/778* (2013.01); *H01L 29/7788* (2013.01); *H01L 29/7789* (2013.01); *H01L 29/861* (2013.01)

(58) Field of Classification Search
CPC ... H01L 29/7606; H01L 27/00; H01L 31/101; B82Y 10/00; B82Y 20/00

USPC .......................................................... 257/29
See application file for complete search history.

(56) References Cited

U.S. PATENT DOCUMENTS

| | | | |
|---|---|---|---|
| 2010/0006823 A1* | 1/2010 | Anderson et al. .............. 257/24 |
| 2010/0163873 A1* | 7/2010 | Cho et al. ........................ 257/53 |
| 2010/0200840 A1 | 8/2010 | Anderson et al. |
| 2012/0049160 A1 | 3/2012 | Sano et al. |
| 2012/0292594 A1* | 11/2012 | Zhou et al. ..................... 257/13 |
| 2012/0326128 A1* | 12/2012 | Shin .................. H01L 21/02378 257/29 |
| 2013/0021758 A1* | 1/2013 | Bernstein et al. ............ 361/728 |
| 2013/0313522 A1* | 11/2013 | Nourbakhsh et al. .......... 257/29 |

FOREIGN PATENT DOCUMENTS

WO     2012093360 A1    7/2012

OTHER PUBLICATIONS

Frank Schwierz, "Graphene transistors", Nature Technology, vol. 5, Jul. 2010, pp. 487-496.
J.B. Oostinga et al., "Gate-induced insulating state in bilayer graphene devices", Nature Materials, vol. 7, Feb. 2008, pp. 151-157.

(Continued)

*Primary Examiner* — Allen Parker
*Assistant Examiner* — Didarul Mazumder

(57) ABSTRACT

In various embodiments, an electronic component is provided. The electronic component may include a dielectric structure; and a two-dimensional material containing structure over the dielectric structure. The dielectric structure is doped with dopants to change the electric characteristic of the two-dimensional material containing structure.

26 Claims, 5 Drawing Sheets

(56) References Cited

OTHER PUBLICATIONS

H. Liu et al., "Chemical doping of graphene", Journal of materials chemistry, RSC Publishing, vol. 21, No. 10, 14 Mar. 2011, pp. 3335-3345.
B.Guo et al., "Graphene doping: A review", Insciences Journal, Nanotechnology, 2011, pp. 80-89.
H. Shimizu et al., "Confirmation of aluminum-induced negative charge in thermally oxidized silicon wafers using AC surface photovoltage method", Jpn. J. Appl. Phys., vol. 33, 1994, pp. 3335-3338.
L. Krusin-Elbaum, "Dependence of the flatband voltage of Si-MOS on Distribution of Cesium in SiO2", J. Electrochem. Soc.: Solic-state science and technology, Aug. 1986, pp. 1712-1715.
K.S. Kim et al., "Large-scale pattern growth of graphene films for stretchable transparent electrodes", Nature Letters, 2009, pp. 1-5.
A. Ismach et al., "Direct chemical vapor deposition of graphene on dielectric surfaces", American Chemical Society, Nano Letters, 2010, pp. 1-15.
Ching-Yuan Su et al., "Direct formation of wafer scale graphene thin layers on insulating substrated by chemical vapor deposition", American Chemical Society, Nano Letters, 2011, pp. 3612-3616.

\* cited by examiner

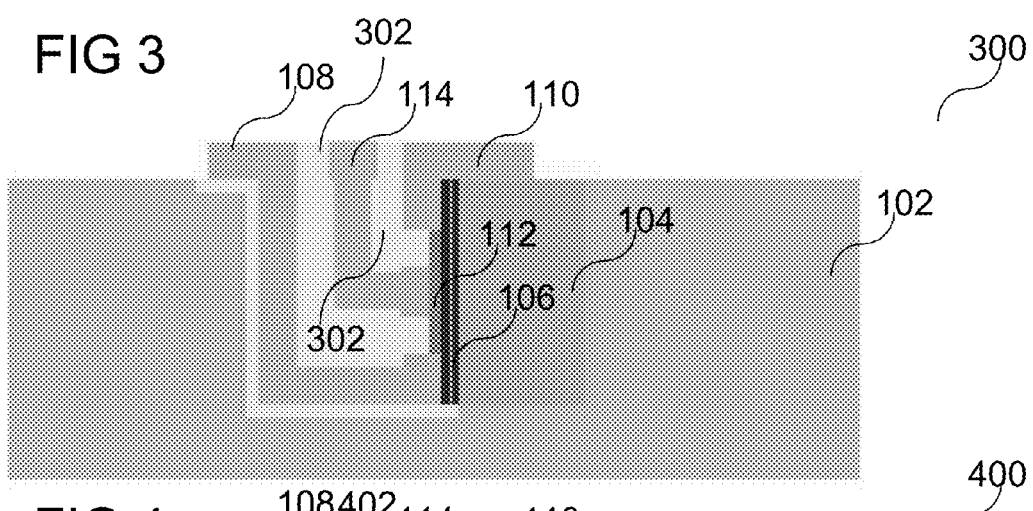
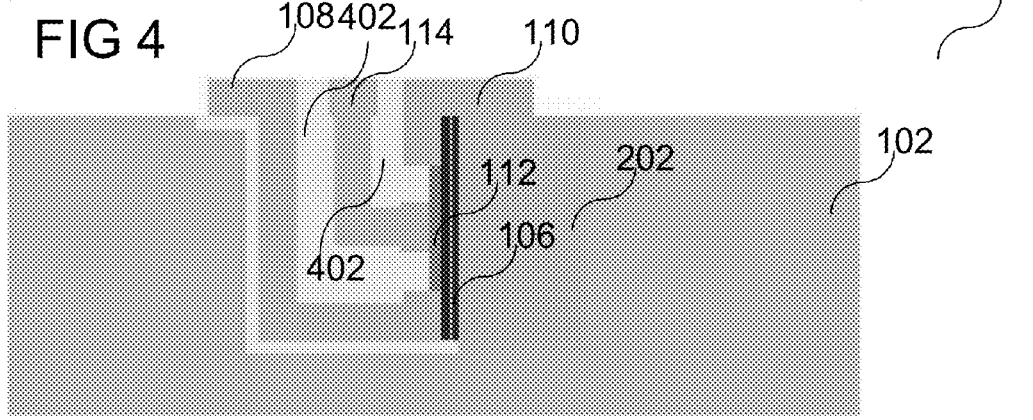

TWO-DIMENSIONAL MATERIAL CONTAINING ELECTRONIC COMPONENTS

TECHNICAL FIELD

Various embodiments relate generally to two-dimensional material containing electronic components.

BACKGROUND

Graphene is a semiconductor material having a very high charge carrier mobility (e.g. in the range from about 50,000 to about 200,000 $cm^2/Vs$ on an insulating substrate). However, monolayer graphene has no bandgap so that a transistor based on graphene cannot be completely switched off. One possibility to generate a bandgap is to provide a two-layer graphene, to which an electric field may be applied perpendicular to the graphene layer direction.

In a conventional embodiment of a transistor based on graphene as described above, the electric field is generated by a further electrode (bottom gate) provided next to the actual gate electrode (top gate) of the transistor. This design requires a correspondingly complex expense for this further electrode. At the same time, the leakage current between the transistor channel and this further electrode results in a corresponding power loss.

Furthermore, graphene is a semiconductor material which is slightly p-type conductive due to interactions with the substrate and adsorbates. The production of n-type conductive graphene or stronger p-type conductive graphene, which is provided for the implementation of pn-junctions, may be realized by corresponding doping.

Conventionally, the doping is carried out by adsorption of dopants which induce an electric field in the graphene. In this case, it may be difficult that these dopants are not stable in particular at an increased temperature during the component manufacturing process. Thus, the pn-junction may degrade. A further possibility is the direct incorporation of the dopants into the graphene, wherein, however, the charge carrier mobility within the graphene layer may degrade due to the lattice imperfection of the $sp^2$ carbon lattice.

SUMMARY

In various embodiments, an electronic component is provided. The electronic component may include a dielectric structure; and a two-dimensional material containing structure over the dielectric structure. The dielectric structure is doped with dopants to change the electric characteristic of the two-dimensional material containing structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows an electronic component in accordance with various embodiments;

FIG. 4 shows an electronic component in accordance with various embodiments;

DESCRIPTION

Figure 1:
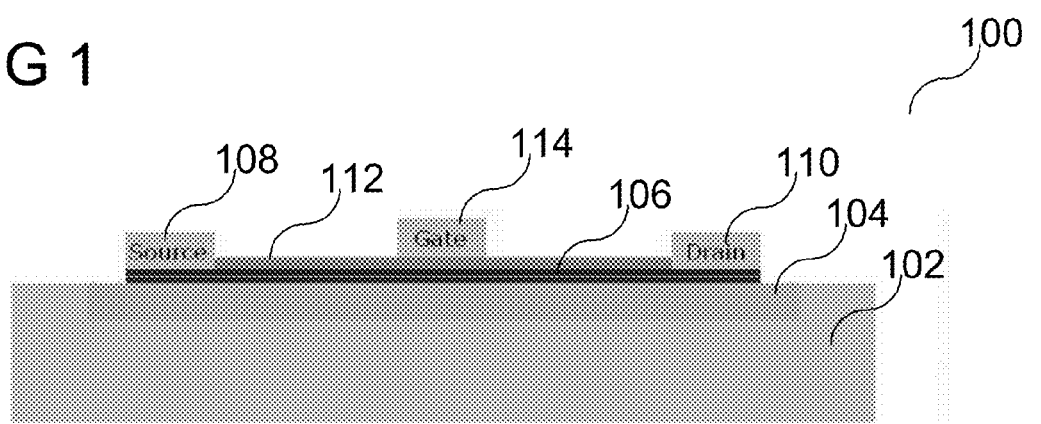
FIG. 1 shows an electronic component in accordance with various embodiments.

The following detailed description refers to the accompanying drawings that show, by way of illustration, specific details and embodiments in which the invention may be practiced.

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "coupling" or "connection" may include both an indirect "coupling" or "connection" and a direct "coupling" or "connection".

Various embodiments illustratively provide dielectrics with incorporated fixed positive and/or negative charge carriers in an electronic component based on two-dimensional material, e.g. based on graphene. The electric characteristic (such as e.g. the threshold voltage of a transistor or the flux voltage of a diode) of the electronic component (e.g the electric characteristic of the two-dimensional material, e.g. of the graphene, e.g. its electric resistance as an example of an electric characteristic) is modified in the desired manner due to the electric fields generated by the dielectric charge carriers.

In various embodiments, a two-dimensional material may include graphene or a metal chalcogenide such as e.g. molybdenum disulphide, tungsten disulphide, or the like.

Graphene, for example, may have an extremely high ampacity (current-carrying capability) of up to $10^8$ A/cm$^2$ so that a very high heating output may be generated without destruction of the graphene.

The term "two-dimensional material" as used herein may, for example, be understood to include or refer to a material that crystallizes in a two-dimensional or planar structure, wherein a first geometric dimension (e.g. thickness) of the structure may be substantially smaller, e.g. at least two orders of magnitude smaller, e.g. at least three orders of magnitude smaller, e.g. at least four orders of magnitude smaller, or even smaller, than a second geometric dimension (e.g. length) and/or a third geometric dimension (e.g. width) of the structure. In one or more embodiments, the term "two-dimensional material" may be understood to include or refer to a material having the thinnest possible structure (one individual layer) derived from a material composed of several layers, e.g. a one carbon atom thick layer as for graphene, or a one MoS$_2$ unit thick layer as for MoS$_2$.

In accordance with one or more embodiments, the two-dimensional material may contain or may be graphene.

In accordance with one or more embodiments, the two-dimensional material may contain or may be a two-dimensional semiconducting material, in other words a two-dimensional material having semiconducting properties.

In accordance with one or more embodiments, the two-dimensional material may contain or may be a two-dimensional metal chalcogenide material, e.g. molybdenum disulphide, or tungsten disulphide.

In accordance with one or more embodiments, a two-dimensional material layer (e.g. a graphene layer) may have a thickness of less than or equal to about 200 nm, for example less than or equal to about 100 nm, for example less than or equal to about 80 nm, for example less than or equal to about 60 nm, for example less than or equal to about 40 nm, for example less than or equal to about 20 nm, for example in the range from about 0.5 nm to about 50 nm, for example about 0.34 nm (e.g. in case of a single monolayer of graphene).

The graphene layer may, for example, be formed with the use of one or more of the following processes in any of the electronic components which will be described in more detail below:

Exfoliation of graphene from graphite by sonication in solvents, e.g. organic solvents a) Chemical reduction of graphene oxide (e.g. exfoliated graphene oxide);

b) Chemical Vapor Deposition (CVD) of graphene;

c) Formation of graphene utilizing solid phase carbon sources;

d) Solid state epitaxial growth of graphene;

e) Process b), c), or d), as mentioned above, in combination with a transfer process onto the desired substrate (e.g. the carrier substrate, e.g. carrier membrane).

Also direct growth is possible on the dielectric substrate by CVD through a catalytic metal film and subsequent removal of the metal film.

The graphene layer may, for example, include or consist of a plurality of crystallites or flakes that may, for example, have a size (e.g. diameter) of a few micrometers, e.g. about 1 µm. In various embodiments, the graphene layer may include a continuous graphene layer extending over the entire substrate. Each of the crystallites may, for example, include or consist of one or more platelets that may, for example, include or consist of a few layers of graphene, e.g. up to five layers, e.g. a monolayer, bilayer, a trilayer, etc., of graphene, wherein a monolayer of graphene may have a two-dimensional structure with a thickness of about 0.34 nm. In one or more embodiments, the graphene layer may be a single monolayer of graphene.

FIG. 1 shows an electronic component 100 in accordance with various embodiments.

The electronic component 100 of FIG. 1 may be configured as a planar component or device (i.e. a component or device in which the current flows substantially parallel to the main processing surface of the component or device or its carrier) such as e.g. a planar transistor, e.g. a planar field effect transistor (FET) 100. The planar FET 100 may include a carrier 102. The carrier 102 may be a substrate (e.g. a wafer substrate), which may be made of semiconductor materials of various types, including silicon, germanium, Group III to V or other types, including polymers, for example, although in another embodiment, other suitable materials can also be used. In various embodiments, the substrate may be made of silicon (doped or undoped), in an alternative embodiment, the substrate may be a silicon on insulator (SOI) wafer. As an alternative, any other suitable semiconductor materials can be used for the substrate, for example semiconductor compound material such as silicon carbide (SiC), gallium nitride (GaN), gallium arsenide (GaAs), indium phosphide (InP), but also any suitable ternary semiconductor compound material or quaternary semiconductor compound material such as indium gallium arsenide (InGaAs). Furthermore, in various embodiments, the substrate 102 may be made of or include dielectric material such as e.g. silicon oxide (SiO$_2$), silicon nitride (Si$_3$N$_4$), silicon carbide (SiC), aluminum oxide (Al$_2$O$_3$), hafnium oxide or zirconium oxide (ZrO$_2$).

The planar FET 100 may further include a dielectric structure 104, e.g. a dielectric layer 104 disposed over or within the carrier 102. In various embodiments, the dielectric structure 104 may thus be made from a different material than the carrier 102 and may e.g. be deposited over the carrier 102, or the dielectric structure 104 may be made of the same material as the carrier 102. By way of example, the dielectric structure 104 may be formed by a portion of the carrier 102 itself In various embodiments, the dielectric structure 104 may include or be made of dielectric material such as e.g. silicon oxide (SiO$_2$) (e.g. undoped having a low positive charge), silicon nitride (Si$_3$N$_4$), silicon carbide (SiC), aluminum aoxide (Al$_2$O$_3$), hafnium oxide or zirconium oxide (ZrO$_2$). In various embodiments, the dielectric structure 104 may be doped with dopants of a conductivity type such as with dopants of a p conductivity type (which may also be referred to in the following as p-type dopants) or with dopants of an n conductivity type (which may also be referred to in the following as n-type dopants). In the electronic component 100 of FIG. 1, the dielectric structure 104 may be doped with p-type dopants such as e.g. nitrogen (N) or cesium (Cs). The dopants may be provided as fixed dielectric charge carriers within the dielectric material of the dielectric structure 104. The fixed dielectric charge carriers provided by the dopants may generate an electric field within the electronic component 100, e.g. to influence the electric characteristic (e.g. the electric conductivity) of a portion of the electronic component (e.g. the electronic component 100) such as e.g. the portion of the electronic component through which an electric current may flow during operation of the electronic component. It is to be noted that this holds true for all electronic components which have been described above and will be described in more detail below. In various embodiments, the concentration or density of the dopants may be settable in a wide range. The dopants may be incorporated or implanted into the dielectric material (e.g. in-situ or after the deposition of the dielectric material) e.g. by means of a vapor deposition process such as e.g. a chemical vapor deposition process (CVD), e.g. an atomic layer deposition process (ALD), or a physical vapor deposition process (PVD), an ion implantation process. The atomic layer deposition process may provide a three-dimensionally smooth deposition (coating) together an extremely good dopant concentration control. The dopants (e.g. N or Cs) may be provided with a doping surface charge in the range from about of $10^{10}$ to about $10^{14}$ cm$^{-2}$, e.g. in the range from about of $10^{11}$ to about $10^{13}$ cm$^{-2}$.

Furthermore, a two-dimensional material containing structure 106 may be arranged over (e.g. in physical contact with) the dielectric structure 104. The two-dimensional material containing structure 106 may include or be made of graphene. The graphene may be provided as a graphene layer structure 106, wherein the graphene layer structure 106 may include a graphene monolayer or a graphene double-layer, for example. The graphene double-layer may provide a bandgap within the graphene layer structure 106, which in turn allows a complete switching off of the FET 100. The graphene double-layer may provide a simplified transistor design together with a reduced power loss. Graphene double layers can be manufactured by transferring two individual graphene layers on each other. Alternatively a graphene double-layer can be deposited on a metal film by CVD or on SiC by epitaxial growth utilizing appropriate growth conditions and transferred to the dielectric substrate. Furthermore, direct growth is possible on the dielectric substrate by CVD through a catalytic metal film and subsequent removal of the metal film. In a double-layer graphene film a bandgap up to about 200 meV can be generated by applying an electrical field perpendicular to the graphene planes. The graphene layer structure 106 may have a layer thickness in the range from about 0.5 nm to about 5 nm, e.g. in the range from about 0.5 nm to about 1 nm.

In various embodiments, the two-dimensional material containing structure 106 may form at least a portion of a channel of the FET 100, in general, the two-dimensional material containing structure 106. The FET 100 may further include a first source/drain region 108 (e.g. a source region 108, e.g. including a source electrode) and a second source/drain region 110 (e.g. a source region 110, e.g. including a drain electrode). The two-dimensional material containing structure 106 may arranged between and electrically coupled the first source/drain region 108 and the second source/drain region 110. Furthermore, a gate insulation layer 112 may be deposited over the two-dimensional material containing structure 106. Moreover, a gate region 114 (e.g. including a gate electrode) may be deposited over the gate insulation layer 112 to control the current flow from the first source/drain region 108 via the two-dimensional material containing structure 106 to the second source/drain region 110 (thus, the dielectric structure 104 is doped with dopants to change the electric characteristic of the two-dimensional material containing structure 106).

The two-dimensional material containing structure 106 and the dielectric structure 104 may be arranged relative to each other such that the dopants provide a local interruption of the pi electron system of the two-dimensional material containing structure 106, e.g. the graphene structure 106.

In these embodiments, the graphene layer structure 106 may e.g. be deposited over or on the dielectric structure 104 by means of the transfer of a graphene layer being deposited on a catalytic metal surface or by means of a direct deposition below the catalyst layer to the dielectric material 104. The FET 100 as well as the other transistors described herein may be configured as a high electron mobility transistor (HEMT).

Figure 2:
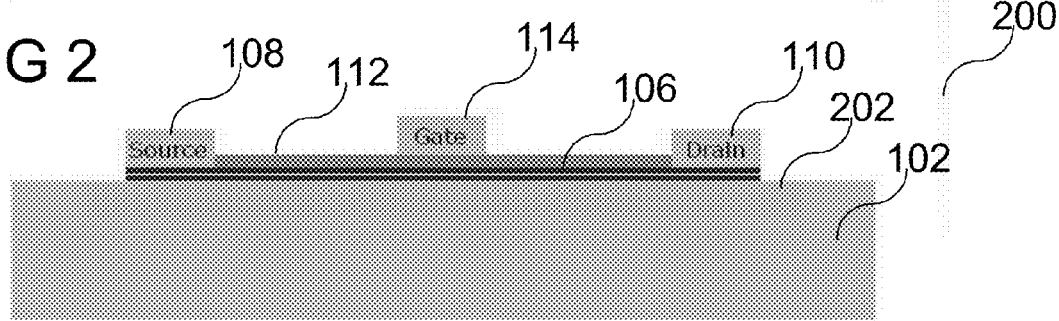
FIG. 2 shows an electronic component in accordance with various embodiments.

FIG. 2 shows an electronic component 200 in accordance with various embodiments.

The electronic component 200 of FIG. 2 is similar to the electronic component 100 of FIG. 1. In the following, only the differences between the electronic component 200 of FIG. 2 and the electronic component 100 of FIG. 1 will be described. With respect to the other features of the electronic component 200 of FIG. 2, it is referred to the description of the respective features of the electronic component 100 of FIG. 1.

In the electronic component 200 of FIG. 2, the dielectric structure 104 may be doped with n-type dopants such as e.g. aluminum (Al). The dopants may be provided as fixed dielectric charge carriers within the dielectric material of the dielectric structure 104. The fixed dielectric charge carriers provided by the dopants may generate an electric field within the electronic component 100, e.g. to influence the electric characteristic (e.g. the electric conductivity) of a portion of the electronic component (e.g. the electronic component 100) such as e.g. the portion of the electronic component through which an electric current may flow during operation of the electronic component. It is to be noted that this holds true for all electronic components which have been described above and will be described in more detail below. In various embodiments, the concentration or density of the dopants may be settable in a wide range. The dopants may be incorporated or implanted into the dielectric material (e.g. in-situ or after the deposition of the dielectric material) e.g. by means of a vapor deposition process such as e.g. a chemical vapor deposition process (CVD), e.g. an atomic layer deposition process (ALD), or a physical vapor deposition process (PVD), an ion implantation process. The atomic layer deposition process may provide a three-dimensionally smooth deposition (coating) together an extremely good dopant concentration control. The dopants (e.g. Al) may be provided with a doping surface charge in the range from about of $10^{10}$ to about $10^{14}$ cm$^{-2}$, e.g. in the range from about of $10^{11}$ to about $10^{13}$ cm$^{-2}$.

FIG. 3 shows an electronic component 300 in accordance with various embodiments.

The electronic component 300 of FIG. 3 is similar to the electronic component 100 of FIG. 1. In the following, only the differences between the electronic component 300 of FIG. 3 and the electronic component 100 of FIG. 1 will be described. With respect to the other features of the electronic component 300 of FIG. 3, it is referred to the description of the respective features of the electronic component 100 of FIG. 1.

The difference between the electronic component 300 of FIG. 3 as compared with the electronic component 100 of FIG. 1 can mainly be seen in that the electronic component 300 of FIG. 3 may be configured as a vertical component or device (i.e. a component or device in which the current flows substantially perpendicular to the main processing surface of the component or device or its carrier) such as e.g. a vertical transistor, e.g. a vertical field effect transistor (FET) 300. Thus, the two-dimensional material containing structure 106 and the gate insulation layer 112 are arranged substantially vertically and thus substantially perpendicular to the main processing surface of the electronic component 300. Furthermore, further dielectric material 302 (e.g. silicon oxide or silicon nitride) is provided between the first source/drain region 108 and the gate region 114 as well as between the gate region 114 and the second source/drain region 110.

FIG. 4 shows an electronic component 400 in accordance with various embodiments.

The electronic component 400 of FIG. 4 is similar to the electronic component 200 of FIG. 2. In the following, only the differences between the electronic component 400 of FIG. 4 and the electronic component 200 of FIG. 2 will be described. With respect to the other features of the electronic component 400 of FIG. 4, it is referred to the description of the respective features of the electronic component 200 of FIG. 2 and of the electronic component 100 of FIG. 1.

The difference between the electronic component 400 of FIG. 4 as compared with the electronic component 200 of FIG. 2 can mainly be seen in that the electronic component 400 of FIG. 4 may be configured as a vertical component or device (i.e. a component or device in which the current flows substantially perpendicular to the main processing surface of the component or device or its carrier) such as e.g. a vertical transistor, e.g. a vertical field effect transistor (FET) 400. Thus, the two-dimensional material containing structure 106 and the gate insulation layer 112 are arranged substantially vertically and thus substantially perpendicular to the main processing surface of the electronic component 400. Furthermore, further dielectric material 402 (e.g. silicon oxide or silicon nitride) is provided between the first source/drain region 108 and the gate region 114 as well as between the gate region 114 and the second source/drain region 110.

Figure 5:
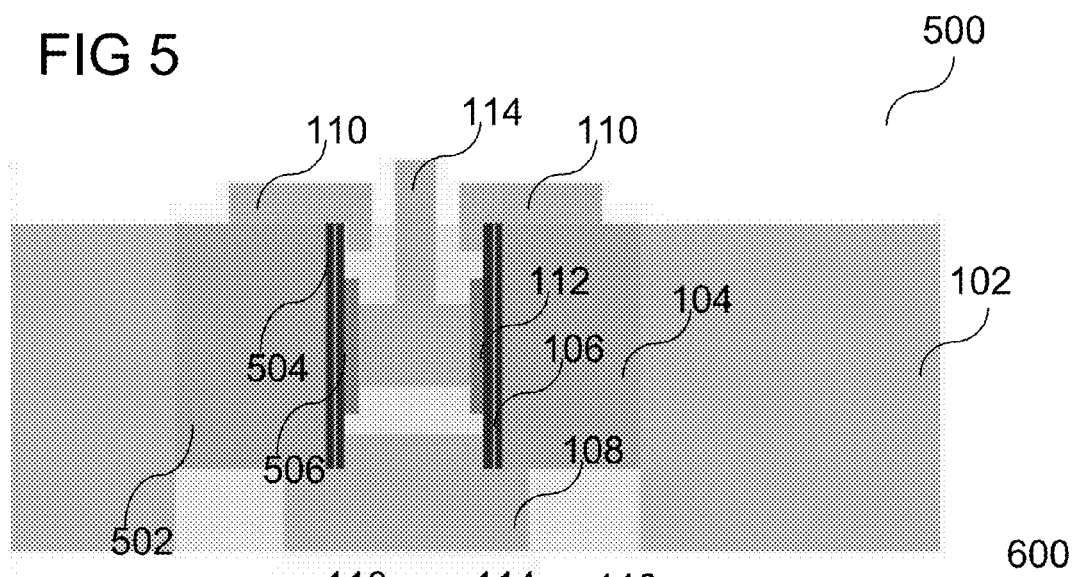
FIG. 5 shows an electronic component in accordance with various embodiments.

FIG. 5 shows an electronic component 500 in accordance with various embodiments.

The electronic component 500 of FIG. 5 is similar to the electronic component 300 of FIG. 3. In the following, only the differences between the electronic component 500 of FIG. 5 and the electronic component 300 of FIG. 3 will be described. With respect to the other features of the electronic component 500 of FIG. 5, it is referred to the description of the respective features of the electronic component 300 of FIG. 3 and of the electronic component 100 of FIG. 1.

The difference between the electronic component 500 of FIG. 5 as compared with the electronic component 300 of FIG. 3 can mainly be seen in that the electronic component 500 of FIG. 5 may be configured as a multi-gate component or device, such as e.g. a vertical double-gate FET 500. The vertical double-gate FET 500 may include an additional dielectric structure 502 and an additional two-dimensional material containing structure 504 which also forms a channel region of the FET 500, as well as an additional gate insulating layer 506. The additional dielectric structure 502 and the dielectric structure 104 may be physically coupled with each other (they may e.g. commonly surround the gate region 114) or they may be arranged at a distance from each other (e.g. they may be arranged on opposite sidewalls of a trench in which the vertical double-gate FET 500 is formed). Furthermore, the additional two-dimensional material containing structure 504 and the two-dimensional material containing structure 106 may also be physically coupled with each other (they may e.g. commonly surround the gate region 114) or they may be arranged at a distance from each other (e.g. they may be arranged on opposite sidewalls of a trench in which the vertical double-gate FET 500 is formed). Finally, the additional gate insulating layer 506 and the gate insulating layer 112 may be physically coupled with each other (they may e.g. commonly surround the gate region 114) or they may be arranged at a distance from each other (e.g. they may be arranged on opposite sidewalls of a trench in which the vertical double-gate FET 500 is formed).

Figure 6:
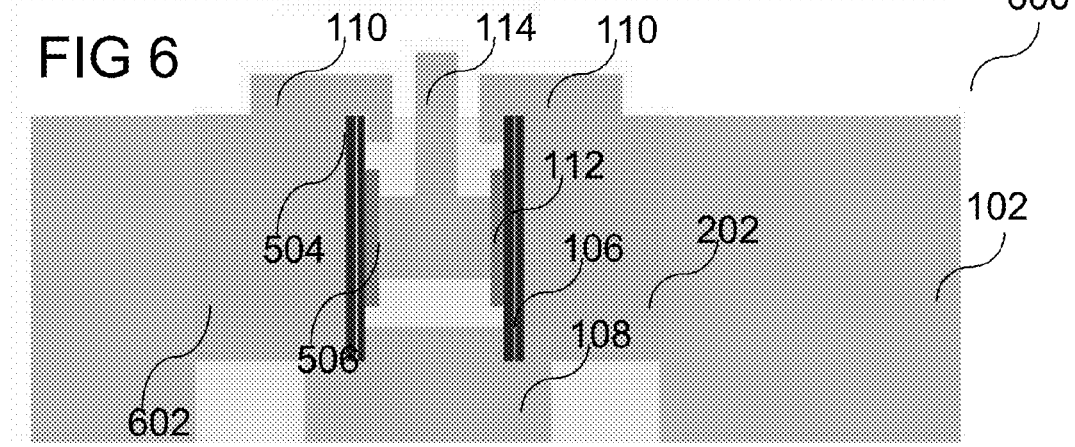
FIG. 6 shows an electronic component in accordance with various embodiments.

FIG. 6 shows an electronic component 600 in accordance with various embodiments.

The electronic component 600 of FIG. 6 is similar to the electronic component 500 of FIG. 5. In the following, only the differences between the electronic component 600 of FIG. 6 and the electronic component 500 of FIG. 5 will be described. With respect to the other features of the electronic component 600 of FIG. 6, it is referred to the description of the respective features of the electronic component 500 of FIG. 5 and of the electronic component 200 of FIG. 2.

In the electronic component 600 of FIG. 6, the dielectric structure 104 may be doped with n-type dopants such as e.g. aluminum (Al). Furthermore, the additional dielectric structure 602 may also be doped with n-type dopants such as e.g. aluminum (Al).

Figure 7:
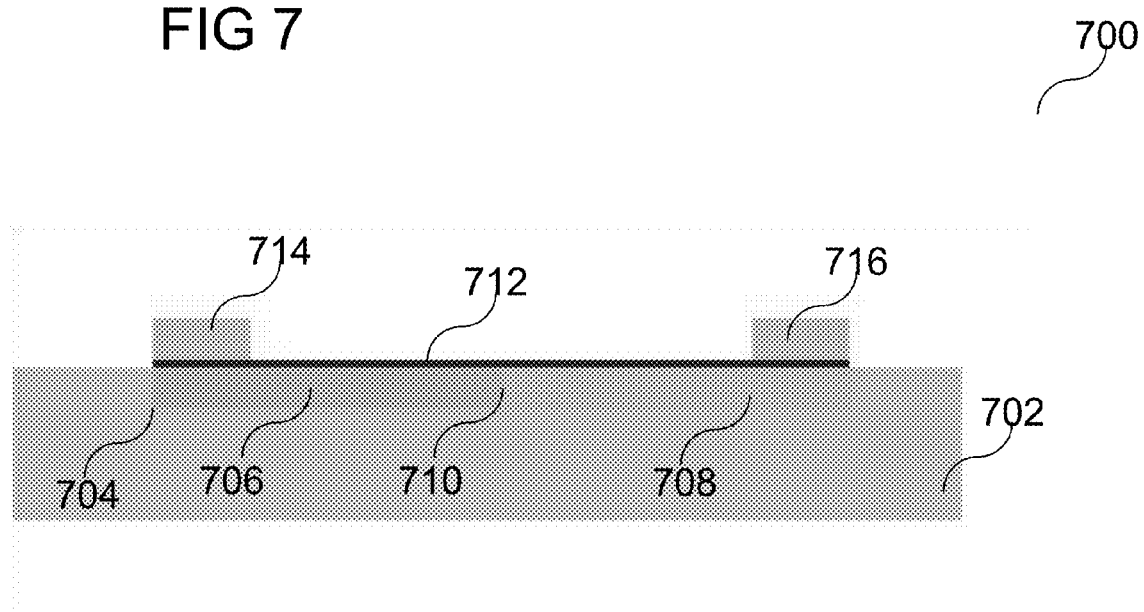
FIG. 7 shows an electronic component in accordance with various embodiments.

FIG. 7 shows an electronic component 700 in accordance with various embodiments.

The electronic component 700 of FIG. 7 may be configured as a planar component or device (i.e. a component or device in which the current flows substantially parallel to the main processing surface of the component or device or its carrier) such as e.g. a planar diode 700. The planar diode 700 may include a carrier 702. The carrier 702 may be a substrate (e.g. a wafer substrate), which may be made of semiconductor materials of various types, including silicon, germanium, Group III to V or other types, including polymers, for example, although in another embodiment, other suitable materials can also be used. In various embodiments, the substrate may be made of silicon (doped or undoped), in an alternative embodiment, the substrate may be a silicon on insulator (SOI) wafer. As an alternative, any other suitable semiconductor materials can be used for the substrate, for example semiconductor compound material such as silicon carbide (SiC), gallium nitride (GaN), gallium arsenide (GaAs), indium phosphide (InP), but also any suitable ternary semiconductor compound material or quaternary semiconductor compound material such as indium gallium arsenide (InGaAs). Furthermore, in various embodiments, the substrate 102 may be made of or include dielectric material such as e.g. silicon oxide ($SiO_2$), silicon nitride ($Si_3N_4$), silicon carbide (SiC), aluminum oxide ($Al_2O_3$), hafnium oxide or zirconium oxide ($ZrO_2$).

The planar diode 700 may further include a dielectric structure 704, e.g. a dielectric layer 704 disposed over or within the carrier 702. In various embodiments, the dielectric structure 704 may thus be made from a different material than the carrier 702 and may e.g. be deposited over the carrier 702, or the dielectric structure 704 may be made of the same material as the carrier 702. By way of example, the dielectric structure 704 may be formed by a portion of the carrier 702 itself In various embodiments, the dielectric structure 704 may include or be made of dielectric material such as e.g. silicon oxide ($SiO_2$) (e.g. undoped having a low positive charge), silicon nitride ($Si_3N_4$), silicon carbide (SiC), aluminum oxide ($Al_2O_3$), hafnium oxide or zirconium oxide ($ZrO_2$). In various embodiments, the dielectric structure 704 may include a first dielectric portion 706 being doped with n-type dopants and a second dielectric portion 708 being doped with p-type dopants, wherein the first dielectric portion 706 and the second dielectric portion 708 are adjacent to each other so that they have a common interface 710. Furthermore, a two-dimensional material containing structure 712 which may include graphene, e.g. a graphene layer 712, e.g. a graphene monolayer 712 may be arranged over, e.g. in physical contact with, at least a portion of the first dielectric portion 706 and at least a portion of the second dielectric portion 708. Illustratively, the two-dimensional material containing structure 712 (which may be one contiguous layer structure) may cover both at least a portion of the first dielectric portion 706 and at least a portion of the second dielectric portion 708.

The fixed dielectric charge carriers provided by the dopants may generate an electric field within the electronic component 100, e.g. to influence the electric characteristic (e.g. the electric conductivity) of a portion of the electronic component (e.g. the electronic component 100) such as e.g. the portion of the electronic component through which an electric current may flow during operation of the electronic component, e.g. of a portion of the two-dimensional material containing structure 712.

In various embodiments, the graphene monolayer 712 may provide a high stability of the doping of the graphene.

The planar diode 700 may further include a first terminal (such as e.g. an anode) 714 in electrical contact with the two-dimensional material containing structure 712. The first terminal 714 may be arranged over the first dielectric portion 706 and thus nearer to the first dielectric portion 706 than to the second dielectric portion 708. Moreover, the planar diode 700 may include a second terminal (such as e.g. an cathode) 716 in electrical contact with the two-dimensional material containing structure 712. The second terminal 716 may be arranged over the second dielectric portion 708 and thus nearer to the second dielectric portion 708 than to the first dielectric portion 706.

Figure 8:
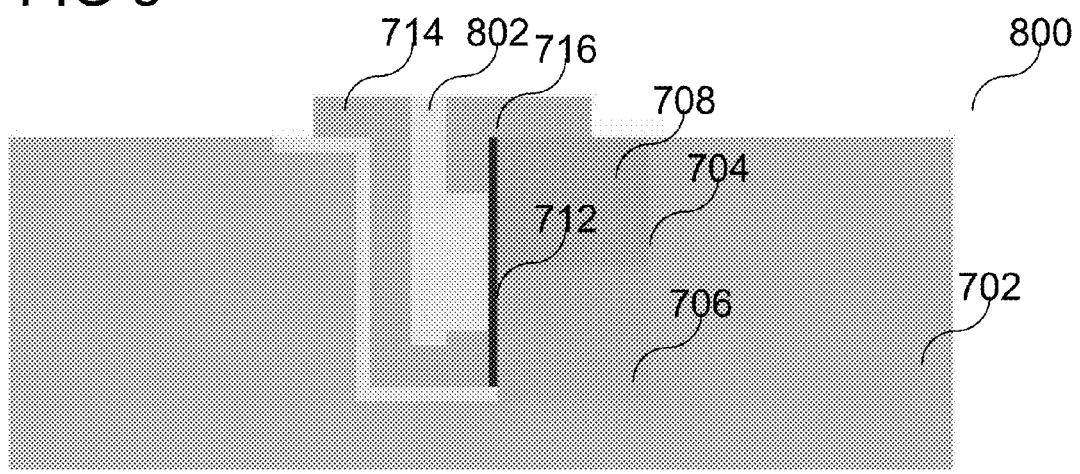
FIG. 8 shows an electronic component in accordance with various embodiments.

FIG. 8 shows an electronic component 800 in accordance with various embodiments.

The electronic component 800 of FIG. 8 is similar to the electronic component 700 of FIG. 7. In the following, only the differences between the electronic component 800 of FIG. 8 and the electronic component 700 of FIG. 7 will be described. With respect to the other features of the electronic component 800 of FIG. 8, it is referred to the description of the respective features of the electronic component 700 of FIG. 7.

The difference between the electronic component 800 of FIG. 8 as compared with the electronic component 700 of FIG. 7 can mainly be seen in that the electronic component 800 of FIG. 8 may be configured as a vertical component or device (i.e. a component or device in which the current flows substantially perpendicular to the main processing surface of the component or device or its carrier) such as e.g. a vertical diode 800. Thus, the dielectric structure 704 and the two-dimensional material containing structure 712 are arranged substantially vertically and thus substantially perpendicular to the main processing surface of the electronic component 800. Furthermore, further dielectric material 802 (e.g. silicon oxide or silicon nitride) is provided between the first terminal 714 the second terminal 716.

Figure 9:
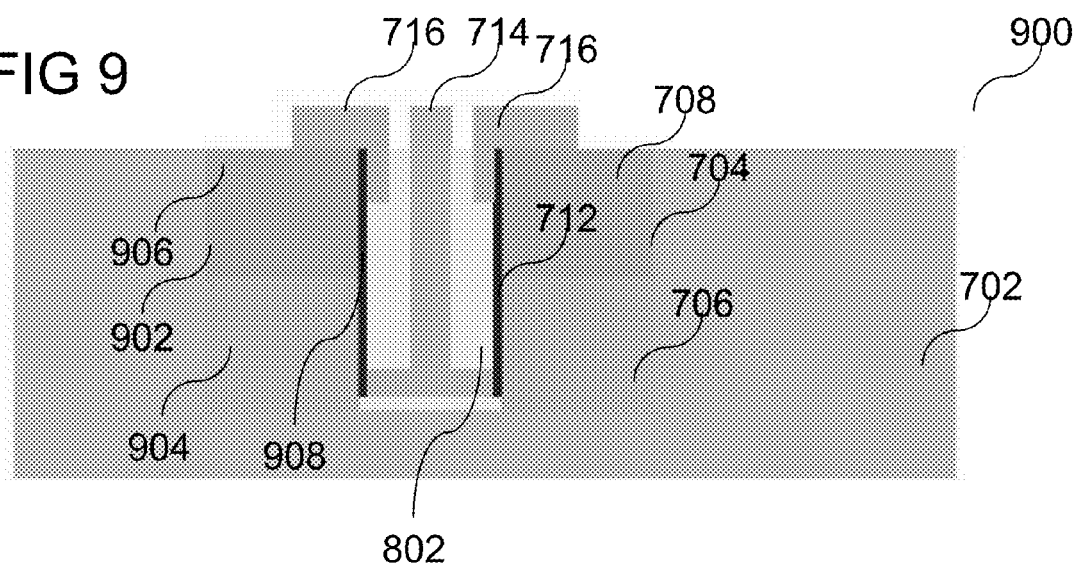
FIG. 9 shows an electronic component in accordance with various embodiments.

FIG. 9 shows an electronic component 900 in accordance with various embodiments.

The electronic component 900 of FIG. 9 is similar to the electronic component 800 of FIG. 8. In the following, only the differences between the electronic component 900 of FIG. 9 and the electronic component 800 of FIG. 8 will be described. With respect to the other features of the electronic component 900 of FIG. 9, it is referred to the description of the respective features of the electronic component 800 of FIG. 8 and of the electronic component 700 of FIG. 7.

The difference between the electronic component 900 of FIG. 9 as compared with the electronic component 800 of FIG. 8 can mainly be seen in that the electronic component 900 of FIG. 9 may be configured as a multi-electrode component or device, such as e.g. a vertical double-electrode diode 900 (e.g. as a double-anode diode 900). The vertical double-electrode diode 900 may include an additional dielectric structure 902 (which may in turn include a first dielectric portion 904 and a second dielectric portion 906) and an additional two-dimensional material containing structure 910. The additional dielectric structure 902 and the dielectric structure 704 may be physically coupled with each other (wherein the additional first dielectric portion 904 may be physically coupled with the first dielectric portion 706 and wherein the additional second dielectric portion 906 may physically coupled with the second dielectric portion 708) or they may be arranged at a distance from each other (e.g. they may be arranged on opposite sidewalls of a trench in which the vertical double-electrode diode 900 is formed). Furthermore, the additional two-dimensional material containing structure 908 and the two-dimensional material containing structure 712 may also be physically coupled with each other or they may be arranged at a distance from each other (e.g. they may be arranged on opposite sidewalls of a trench in which the vertical double-electrode diode 900 is formed).

In various embodiments, an electronic component is provided. The electronic component may include a dielectric structure; and a two-dimensional material containing structure over the dielectric structure; wherein the dielectric structure is doped with dopants to change the electric characteristic of the two-dimensional material containing structure.

The dielectric structure may be doped with p-type dopants. The p-type dopants may be selected from a group of doping atoms consisting of: nitrogen; and cesium. Furthermore, the dielectric structure may be doped with n-type dopants, wherein the n-type dopants may contain aluminum. The dielectric structure may include a dielectric material selected from a group of dielectric materials consisting of: an oxide; a nitride; and an oxynitride. Furthermore, the dielectric structure may include a dielectric material selected from a group of dielectric materials consisting of: silicon oxide; silicon nitride; siliconoxynitride; silicon carbide; aluminum oxide; hafnium oxide and zirconium oxide. The dielectric structure may include a first dielectric portion being doped with n-type dopants and a second dielectric portion being doped with p-type dopants, wherein the first dielectric portion and the second dielectric portion are adjacent to each other. The electronic component may be configured as a diode or as a transistor. The two-dimensional material containing structure may form a channel region of the transistor. The electronic component may be configured as a planar electronic component or as a vertical electronic component. The two-dimensional material containing structure may include graphene. As an alternative, the two-dimensional material containing structure may include a metal chalcogenide. The two-dimensional material containing structure may include a plurality of layers so that a band gap is provided between at least two layers of the plurality of layers.

In various embodiments, an electronic component is provided. The electronic component may include a dielectric material comprising dopants; and a two-dimensional material layer disposed over the dielectric material so that dopants change the electric characteristic of the two-dimensional material layer.

The dielectric material may be doped with p-type dopants. The dielectric material may be doped with n-type dopants.

The dielectric material may be selected from a group of dielectric materials consisting of: an oxide; a nitride; and an oxynitride. The dielectric structure material may include a first dielectric portion being doped with n-type dopants and a second dielectric portion being doped with p-type dopants, wherein the first dielectric portion and the second dielectric portion are adjacent to each other. The electronic component may be configured as a diode or as a transistor. The two-dimensional material containing structure may form a channel region of the transistor. The two-dimensional material containing structure may include a plurality of layers so that a band gap is provided between at least two layers of the plurality of layers.

In various embodiments, an electronic component is provided. The electronic component may include a dielectric material comprising dopants; and a graphene containing layer structure disposed over the dielectric material; wherein the dopants change the electric characteristic of the graphene containing layer.

The graphene containing layer structure may include a plurality of graphene containing layers so that a band gap is provided between at least two graphene containing layers of the plurality of graphene containing layers.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic component, comprising:
a dielectric layer comprising a dielectric material selected from a group of dielectric materials consisting of an oxide, a nitride, a carbide and an oxynitride; and
a two-dimensional material containing structure over the dielectric layer;
wherein the dielectric material is doped with dopants within the dielectric material, the dopants comprising fixed charge carriers within the dielectric material changing the electric characteristic of the two-dimensional material containing structure.

2. The electronic component of claim 1,
wherein the dielectric structure is doped with p-type dopants.

3. The electronic component of claim 2,
wherein the p-type dopants are selected from a group of doping atoms consisting of:
nitrogen; and
cesium.

4. The electronic component of claim 1,
wherein the dielectric structure is doped with n-type dopants.

5. The electronic component of claim 4,
wherein the n-type dopants contain aluminum.

6. The electronic component of claim 1,
wherein the dielectric structure comprises a dielectric material selected from a group of dielectric materials consisting of:
silicon oxide;
silicon nitride;
siliconoxynitride;
silicon carbide;
aluminum oxide;
hafnium oxide and
zirconium oxide.

7. The electronic component of claim 1,
wherein the dielectric structure comprises a first dielectric portion being doped with n-type dopants and a second dielectric portion being doped with p-type dopants, wherein the first dielectric portion and the second dielectric portion are adjacent to each other.

8. The electronic component of claim 7,
being configured as a diode.

9. The electronic component of claim 1,
being configured as a transistor.

10. The electronic component of claim 9,
wherein the two-dimensional material containing structure forms a channel region of the transistor.

11. The electronic component of claim 1,
being configured as a planar electronic component.

12. The electronic component of claim 1,
being configured as a vertical electronic component.

13. The electronic component of claim 1,
wherein the two-dimensional material containing structure comprises graphene.

14. The electronic component of claim 1,
wherein the two-dimensional material containing structure comprises a metal chalcogenide.

15. The electronic component of claim 1,
wherein the two-dimensional material containing structure comprises a plurality of layers so that a band gap is provided between at least two layers of the plurality of layers.

16. An electronic component, comprising:
a dielectric layer comprising a dielectric material and dopants incorporated within the dielectric material; and
a two-dimensional material layer disposed over the dielectric layer, wherein the dopants comprise fixed charges in the dielectric material changing the electric characteristic of the two-dimensional material layer.

17. The electronic component of claim 16,
wherein the dielectric material is doped with p-type dopants.

18. The electronic component of claim 16,
wherein the dielectric material is doped with n-type dopants.

19. The electronic component of claim 16,
wherein the dielectric material is selected from a group of dielectric materials consisting of:
an oxide;
a nitride; and
an oxynitride.

20. The electronic component of claim 16,
wherein the dielectric structure material comprises a first dielectric portion being doped with n-type dopants and a second dielectric portion being doped with p-type dopants, wherein the first dielectric portion and the second dielectric portion are adjacent to each other.

21. The electronic component of claim 20,
being configured as a diode.

22. The electronic component of claim 16,
being configured as a transistor.

23. The electronic component of claim 16,
wherein the two-dimensional material containing structure forms a channel region of the transistor.

24. The electronic component of claim 16,
wherein the two-dimensional material containing structure comprises a plurality of layers so that a band gap is provided between at least two layers of the plurality of layers.

25. An electronic component, comprising:
a dielectric layer comprising dopants within a dielectric material of the dielectric layer; and
a graphene containing layer structure disposed over the dielectric layer;
wherein the dopants comprise fixed charges changing the electric characteristic of the graphene containing layer.

26. The electronic component of claim 25,
wherein the graphene containing layer structure comprises a plurality of graphene containing layers so that a band gap is provided between at least two graphene containing layers of the plurality of graphene containing layers.

* * * * *